(12) United States Patent
Smerzi et al.

(10) Patent No.: US 11,854,977 B2
(45) Date of Patent: Dec. 26, 2023

(54) GAN-BASED, LATERAL-CONDUCTION, ELECTRONIC DEVICE WITH IMPROVED METALLIC LAYERS LAYOUT

(71) Applicant: STMICROELECTRONICS S.R.L., Agrate Brianza (IT)

(72) Inventors: Santo Alessandro Smerzi, Catania (IT); Maria Concetta Nicotra, Catania (IT); Ferdinando Iucolano, Gravina di Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 461 days.

(21) Appl. No.: 16/676,371

(22) Filed: Nov. 6, 2019

(65) Prior Publication Data

US 2020/0152572 A1    May 14, 2020

(30) Foreign Application Priority Data

Nov. 9, 2018   (IT) .................. 102018000010195

(51) Int. Cl.
| | |
|---|---|
| *H01L 23/528* | (2006.01) |
| *H01L 23/522* | (2006.01) |
| *H01L 29/20* | (2006.01) |
| *H01L 29/417* | (2006.01) |
| *H01L 29/423* | (2006.01) |

(52) U.S. Cl.
CPC ...... *H01L 23/5286* (2013.01); *H01L 23/5226* (2013.01); *H01L 29/2003* (2013.01); *H01L 29/41725* (2013.01); *H01L 29/42316* (2013.01)

(58) Field of Classification Search
CPC ............. H01L 23/5286; H01L 23/5226; H01L 29/2003; H01L 29/41725; H01L 29/42316; H01L 23/4824
See application file for complete search history.

(56) References Cited

U.S. PATENT DOCUMENTS

| | | | |
|---|---|---|---|
| 5,672,894 A | 9/1997 | Maeda et al. |
| 8,791,508 B2 | 7/2014 | Roberts et al. |
| 9,659,854 B2 | 5/2017 | Klowak et al. |
| (Continued) | | |

OTHER PUBLICATIONS

Hastings, *The Art of Analog Layout*, Prentice Hall, Saddle River, New Jersey, 2001, Chapters 11 "MOS Transistors" and 12 "Applications of MOS Transistors", pp. 363-444 (95 pages).

(Continued)

*Primary Examiner* — Benjamin Tzu-Hung Liu
(74) *Attorney, Agent, or Firm* — SEED INTELLECTUAL PROPERTY LAW GROUP LLP (57) ABSTRACT

An electronic device, comprising plurality of source metal strips in a first metal level; a plurality of drain metal strips in the first metal level; a source metal bus in a second metal level above the first metal level; a drain metal bus, in the second metal level; a source pad, coupled to the source metal bus; and a drain pad, coupled to the drain metal bus. The source metal bus includes subregions shaped in such a way that, in top-plan view, each of them has a width which decreases moving away from the first conductive pad; the drain metal bus includes subregions shaped in such a way that, in top-plan view, each of them has a width which decreases moving away from the second conductive pad. The first and second subregions are interdigitated.

20 Claims, 7 Drawing Sheets

(56) References Cited

U.S. PATENT DOCUMENTS

2009/0096435 A1* 4/2009 Ueunten ............. H01L 23/4824
257/E27.009
2019/0280089 A1* 9/2019 Bunin ............... H01L 29/41758

OTHER PUBLICATIONS

Longford, A. et al., "Utilising Advanced Packaging Technologies to enable Smaller, More Efficient GaN Power Devices," *EMPC*2013, Grenoble, France, Sep. 9-12, 2013, 5 pages.

Roberts, J., "Maximizing GaN Power Transistor Performance with Embedded Packaging," *Applied Power Electronics Conference and Exposition* 2015, Charlotte, North Carolina, Mar. 15-19, 2015, 26 pages.

* cited by examiner

GAN-BASED, LATERAL-CONDUCTION, ELECTRONIC DEVICE WITH IMPROVED METALLIC LAYERS LAYOUT

BACKGROUND

Technical Field

The present disclosure relates to an electronic device, in particular of a lateral conduction type and with improved layout of one or more metallic layers.

In particular, the present disclosure relates to the enhancement of current rating of a lateral power device.

Description of the Related Art

It is well known that the current rating of lateral power devices are limited by the capability of the metallizations in integrated technologies to drive high currents, due to electromigration and self-heating.

Methods for manufacturing interconnections, such as chip bumping, flip chip and 3D advanced packaging processes, have been developed to exploit the superior performance of GaN-based devices, in terms of high dielectric strength, high operating temperature, high current density, high speed switching and low on-resistance.

Examples of application where GaN-based devices are employed include switch mode power supplies (SMPS), motor control, energy conversion, automotive hybrid and electric vehicle applications, power factor correction (PFC) systems.

Gallium nitride, with its higher power and temperature capabilities, can be used to manufacture efficient power control devices for PFC systems, as the packaged parts support high current loads, up to 40 A, and voltages up to 1200 V.

In switch mode power supplies (SMPS), GaN transistors and diodes are used with operating voltages from 100 to 1,000 V, and are able to handle currents between 3 and 300 A.

The main motivation for improvement in the field of GaN power applications is to enhance the current rating without using complex embedded systems (e.g., back-end (BE) post-processing and on-package plating) and providing long term reliability of the devices.

The current ratings of GaN lateral power devices are limited by the capability of the metallizations in integrated technologies to drive high currents (e.g., of the order of 50 A) due to electromigration and self-heating.

Known solutions to the above problem include the book authored by A. Hastings, titled "The Art of Analog Layout", Pearson, 2006, disclosing lateral power devices (e.g., MOSFETs, LDMOS) where the current is conventionally carried by on-die interdigitated structures. In such configurations, large die area is occupied by pads for connecting wirings and current buses. However, GaN devices are currently adopted in power applications where high-efficiency and high power density are desired. Classical interdigitated structures are no more suitable for GaN power devices, which are typically rated for very high-currents (>10 A). Indeed, large die area would be sacrificed to implement wide metal interconnections that would avoid electromigration failure. Electromigration in conventional interdigitated metallization patterns is detrimental for the specific on-resistance Rsp (given by $R_{ON} \times Area$), which is one of the most important Figure-of-Merit (FOM) for power devices. Small values of specific on-resistance Rsp denote area-efficient layouts.

Recently, other solutions have been proposed to provide very high current switching capability for lateral GaN transistors. Reference is made, for example, to the works of A. Longford et. al., "Utilising Advanced Packaging Technologies to Enable Smaller, More Efficient GaN Power Devices", EMPC 2013; and of J. Roberts, "Maximizing GaN Power Transistor Performance with Embedded Packaging", presentation at APEC 2015, whose content is also disclosed in U.S. Pat. No. 8,791,508.

Electromigration concerns that have previously limited the current capability of lateral GaN transistors are addressed, in the above-identified works, by adopting thick metallizations offered by complex back-end (BE) processes (i.e., die post-processing and packaging).

BRIEF SUMMARY

One or more embodiments of the present disclosure provide an electronic device that overcomes at least some of the issues mentioned above. Specifically, the present disclosure addresses the issues of the known art by providing proper geometries of on-chip metallizations of the electronic device, without affecting the specific on-resistance of the device.

According to the present disclosure, an electronic device is provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

An object of the present disclosure is to enhance the current rating of lateral power devices without using complex embedded systems (e.g., without using BE post-processing and on-package plating) and without affecting the specific on-resistance of the power device.

In an embodiment of the present disclosure, the electromigration issue of a GaN-based device is addressed by properly shaping one or more on-die metallizations. Throughout the present description and figures, pads, fingers and connections related to the gate terminals of the GaN-based device are omitted, since they are secondary to the inventive concept of the present solution.

Figure 1:
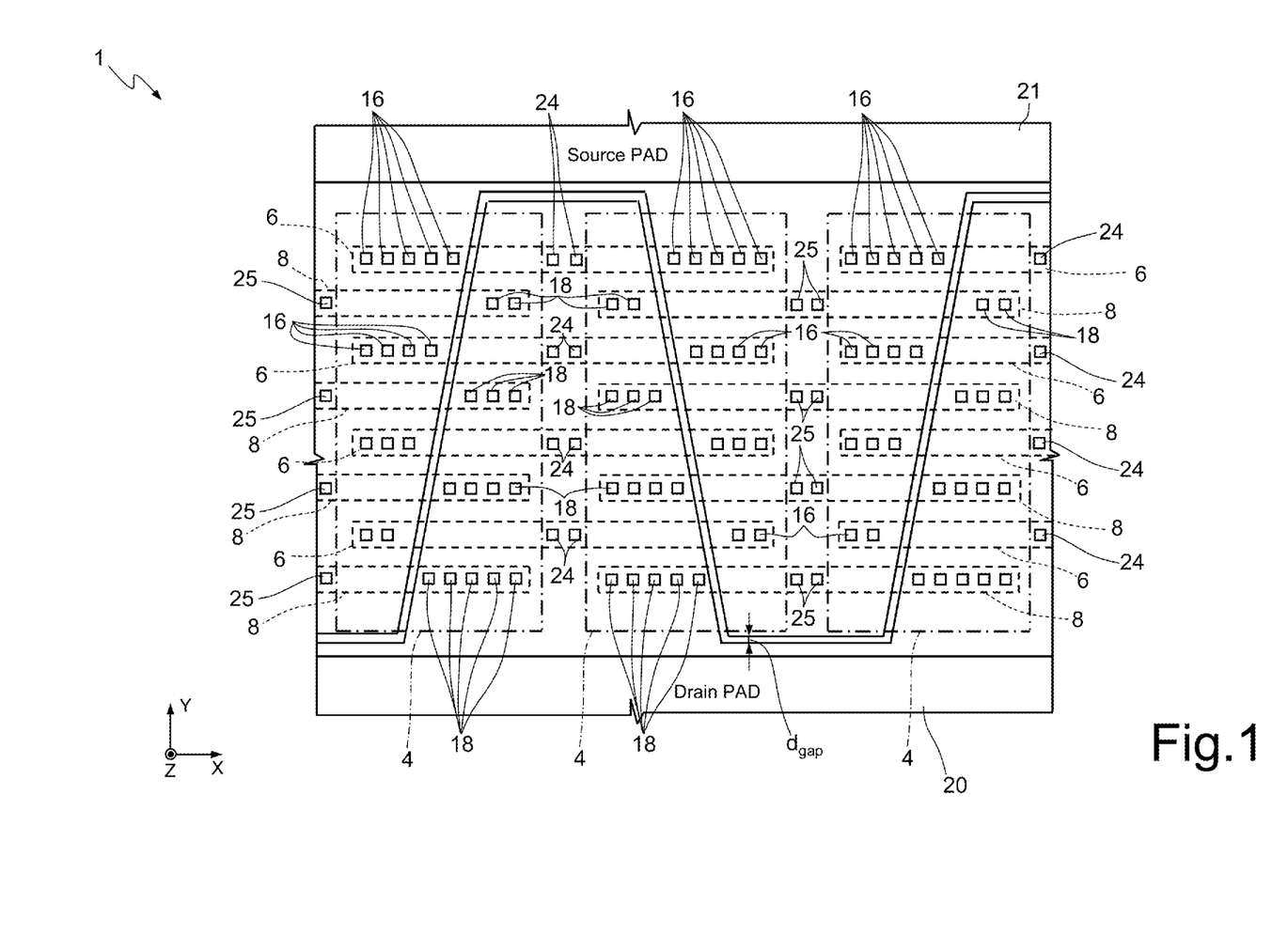
FIG. 1 is a top-plan view of part of an electronic device, according to an embodiment of the present invention.
Figure 2:
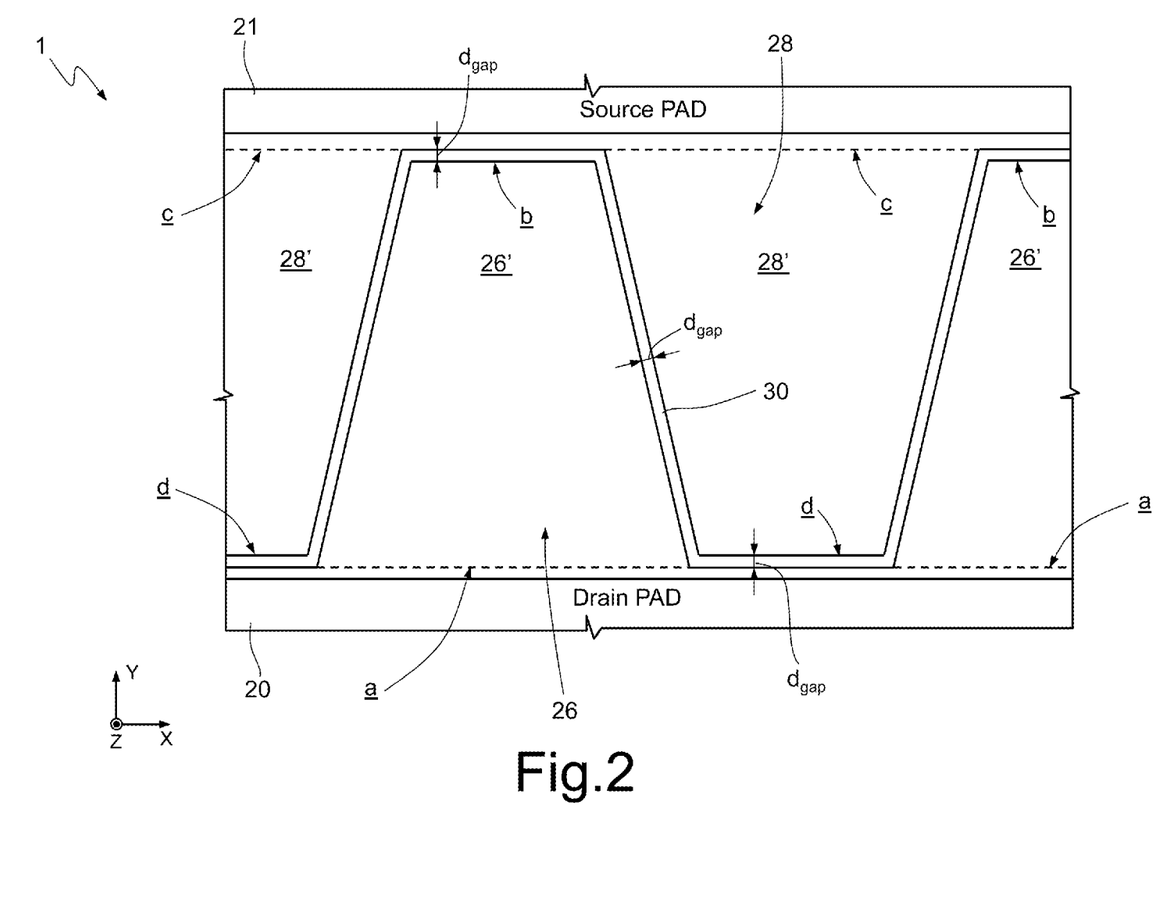
FIG. 2 is a simplified view of FIG. 1.

FIG. 1 is a top-plan view of a device 1 (namely, a GaN-based device), according to an aspect of the present disclosure. FIG. 2 is a simplified view of the device 1, based on FIG. 1. FIGS. 1 and 2 are represented in an orthogonal system of axis X, Y, Z; the top-plan view is a view on plane XY.

Figure 3:
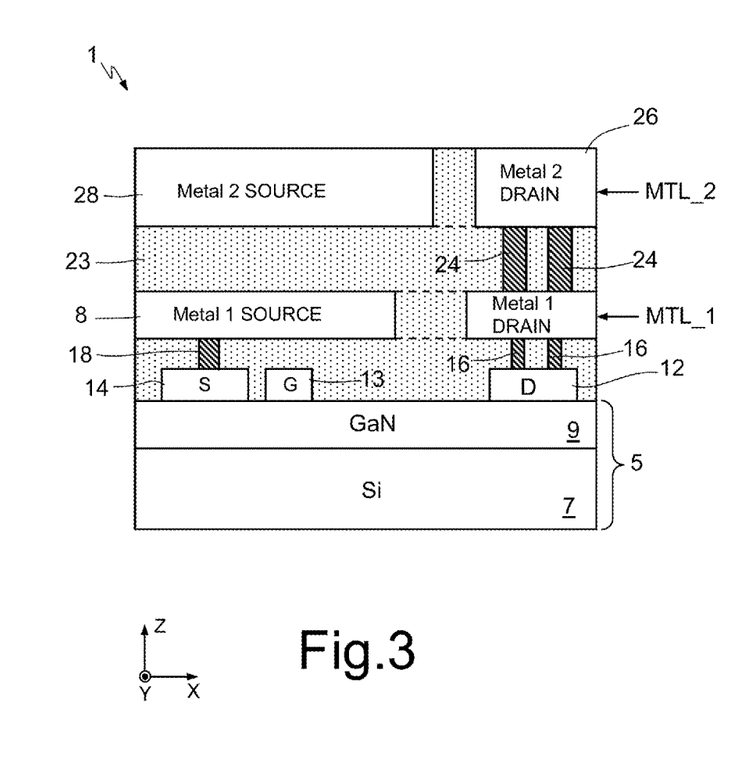
FIGS. 3 and 4 are respective lateral cross sections of the device of FIG. 1.
Figure 4:
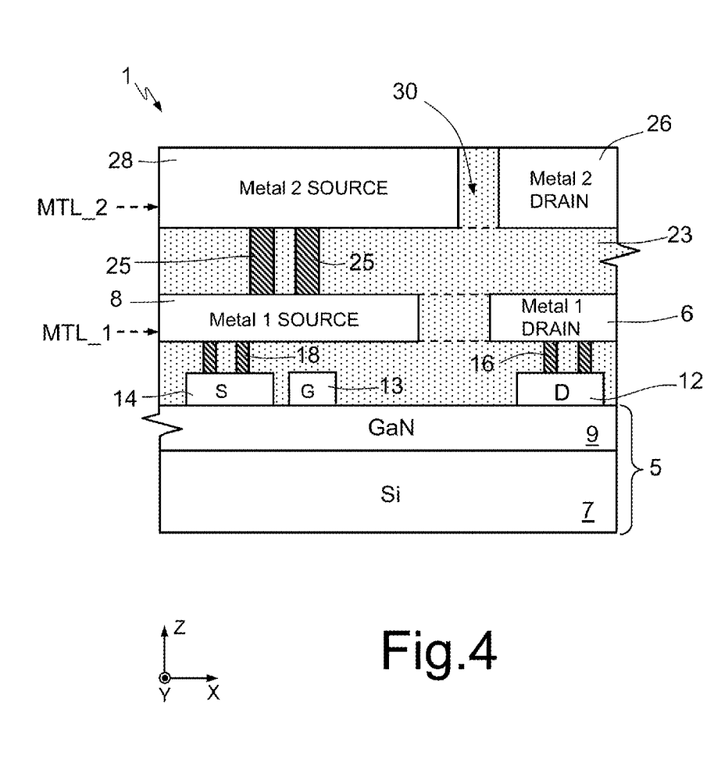

FIGS. 3 and 4 show exemplary cross-sectional views of respective portions of device 1, where a stack of layers forming the device 1 is represented. Here, a first metal layer MTL_1 and a second metal layer MTL_2, above the first metal layer MTL_1, are shown. Conduction terminals of the device 1 (namely, drain terminal 12, gate terminal 13 and source terminal 14) extends below the first metal layer MTL_1.

FIG. 3 relates to a section where metal vias 24 between first and second metal layers MTL_1, MTL_2, and contacts 16 between the drain terminal and the first metal layers MTL_1, are present.

FIG. 4 relates to a section where metal vias 25 between the first metal layer MTL_1 and the second metal layer MTL_2, and contacts 18 between the source terminal 14 and the first metal layers MTL_1, are present.

In the context of the present disclosure, the term "contact" is referred to an electrical connection between a first metal layer MTL_1 and the conduction terminal(s) (source/drain terminals) of the device 1 below the first metal layer MTL_1; the term "via" is referred to an electrical connection between metal layers.

With reference to FIGS. 3 and 4, a structural body, including a substrate 7 (e.g., of silicon) and an epitaxial layer 9 (here, of GaN), is identified with reference numeral 5. In the epitaxial layer 9, in a manner which is known in the art, source and drain regions (not shown) are formed, e.g., through ohmic contact formation. During use, a conduction channel is formed in the epitaxial layer 9 between source and drain regions, under control of the gate terminal 13. Drain and source terminals 12, 14 (made of conductive material such as metal) are in electrical contact with the source and drain regions, and configured to bias the source and drain regions during use of device 1. The gate terminal 13 is arranged between the drain and source terminals 12, 14, in a per se known manner. It is to be understood that the device 1 includes a plurality of drain and source regions and a respective plurality of drain, gate and source terminals 12, 13, 14, extending parallel to the Y axis.

The metal layers MTL_1 and MTL_2 are buried in, and electrically insulated from one another by a passivation layer 23, made of dielectric or insulating material such as $SiO_2$, or $Si_3N_4$, or another passivation material.

With joint reference to FIGS. 1 to 4, the device 1 includes a plurality of modules 4 electrically connected to one another in a parallel configuration. Each module 4 identifies an active area of the device, i.e., the area where, during use, the conduction channel between source and drain is formed under the control of the gate terminal. Each device module 4 houses a plurality of drain metal fingers 6 and source metal fingers 8, formed in the first metal layer MTL_1. Vertical contacts 16, 18 connect each drain and source finger 6, 8 to drain and source terminal 12, 14 of the device 1, to bias, during use, the drain and source terminal 12, 14; in other words, the first metal layer MTL_1 supplies proper bias to source and drain regions of the device 1. As said, gate metal fingers are also present, connected to the gate terminal 13, to bias the gate terminal 13, but not shown in the drawings for improved clarity. The specific arrangement of gate metal fingers is not relevant to the present disclosure.

Metal buses 26, 28 of the highest on-die metallization level (here, the second metal layer MTL_2) distribute the electrical current sourced/sunk by drain and, respectively, source pads 20, 21 to the respective drain and source fingers 6, 8 of the device 1, to be then supplied to the drain/source terminals 12, 14 for biasing them. The current in the buses is distributed along a main direction which is parallel to the Y axis, i.e., moving away from the respective drain/source pad 20, 21.

Figure 9A:
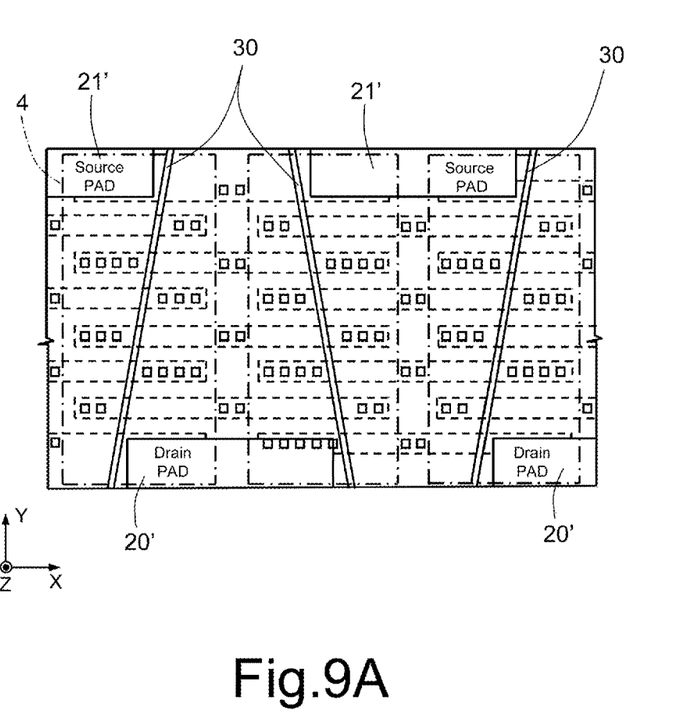
FIGS. 9A, 9B show further embodiments according to respective aspects of the present disclosure.
Figure 9B:
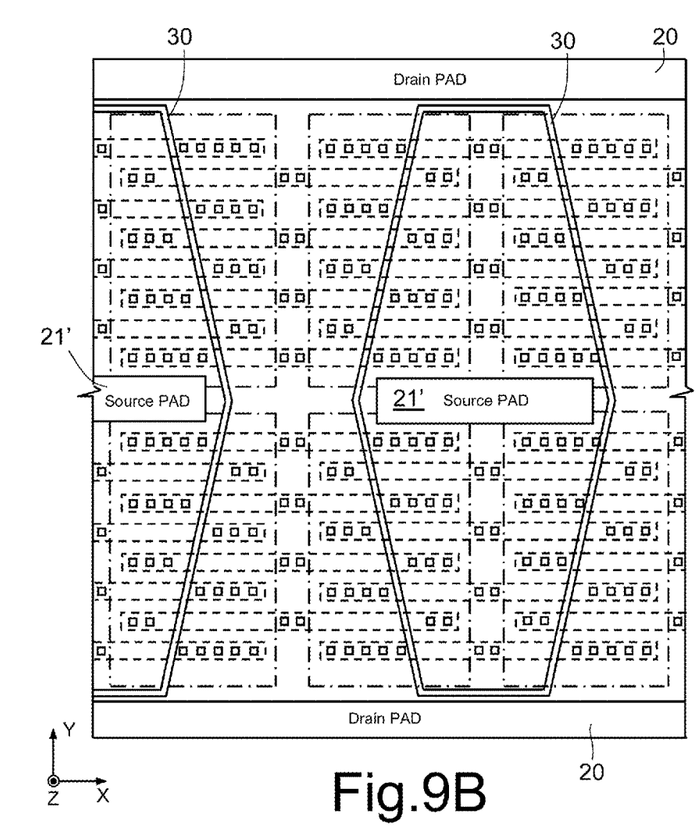

In the embodiment shown in FIG. 1, the drain pad 20 and the source pad 21 have a main direction of extension along the X axis, and are shaped in such a way to be parallel to one another and to the X axis. The electrical current is therefore distributed to the fingers 6, 8 through the metal buses 26 and 28, whose electrical current is along a direction which is transverse to the main direction of extension of the pads 20, 21. It is apparent that the pads 20, 21 may be formed according to a different layout, for example as shown in FIGS. 9A and 9B, discussed later on.

Each device module 4 is overlapped (considering the layout on XY plane) by the metal buses 26, 28, and, more specifically, the overlap area of one module 4 and the drain bus 26 is equal to the overlap area of the same module 4 and the source bus 28. This relation is valid for each module 4 of the device 1. Each drain/source bus 26, 28 is connected to the drain/source fingers 6, 8 through the conductive vias 24, 25.

According to an aspect of the present disclosure, the metal buses 26, 28 are shaped in such a way to have, in top plan view, a variable width (along X axis), when moving along the Y axis. More specifically, the width of metal buses 26, 28 varies according to the current density at each considered section, along Y axis, of the metal buses 26, 28 (higher current in a section requires a larger metal bus at that section to reduce the current density). Accordingly, the drain/source buses 26, 28 are wider close to the respective drain/source pad 20, 21, whereas they are narrower moving away from the respective drain/source pad 20, 21.

As it can be better appreciated from the top plan view of FIG. 2, the drain bus 26 is formed by a plurality of interconnected subregions 26', each of them having a substantially trapezoidal shape, with: main side a adjacent to the drain pad 20; minor side b, which is parallel to the main side a, facing the source pad 21; and oblique sides connecting the main side a to the minor side b. Analogously, the source bus 28 is formed by a plurality of interconnected subregions 28' having a substantially trapezoidal shape, with: main side c adjacent to the source pad 21; minor side d, which is parallel to the main side c, facing the drain pad 20; and oblique sides connecting the main side c to the minor side d.

The trapezoidal-shaped subregions 26', 28' of the drain and source buses 26, 28 are defined and delimited at the minor and oblique sides by an insulating region 30, which electrically isolates the drain and source buses 26, 28 from one another. The insulating region 30 is part of the passivation layer 23, as it can be appreciated from FIGS. 3 and 4.

Each subregion 26' of the drain bus 26 is electrically connected to the other subregion 26' and to the drain pad 20 at the main sides a, while each subregion 28' the source bus 28 is electrically connected to the other subregion 28' and to the source pad 21 at the main sides c.

The insulating region 30 guarantees the electrical isolation between the drain metal bus 26 and the source metal bus 28.

The insulating region 30 has a width $d_{gap}$, in the top-plan view, which, according to an embodiment, is constant and is chosen as better described later on. According to other embodiments, the width $d_{gap}$, in the top-plan view, may vary (i.e., it is not constant), in such a way to guarantee the isolation between terminals also where the electric field is more intense (i.e., at corners or, in general, where the curvature radius of the buses 26, 28 is low).

Considering the drain current, the current is higher close to the drain pad 20 and decreases moving away from the pad 20 along the Y axis. The width along X of the subregion 26' is maximum in correspondence of the drain pad 20 and decreases moving away from it along the Y axis. Considering the source current, the current is higher close to the source pad 21 and decreases moving away from the pad 21 along the Y axis. The width along X of the subregion 28' is maximum in correspondence of the source pad 21 and decreases moving away from it along the Y axis.

More specifically, the width along X axis of the subregions 26', 28' of the drain and source metal buses 26, 28 varies according to the gradient of the current distribution, i.e., the width has maximum value where the current is more concentrated (higher current density), and decreases where the current is less concentrated (lower current density). Current is higher close the drain/source pads 20, 21, whereas it gradually decreases departing from the drain/source pads 20, 21 (i.e., moving away from the respective source/drain pad 20, 21 along the Y axis).

To avoid electromigration, the current density at each section of the drain/source metal bus 20, 21 should be contained below the maximum allowable current density to avoid electromigration. The maximum allowable current density depends on the actual material used for manufacturing the drain/source metal buses 20, 21. For example, a drain/source metal bus 20, 21 of AlCu having a thickness (along Z axis) of about 4.5 μm, carries a maximum current of about 9 mA/μm before undergoing electromigration issues.

The number of conductive contacts and vias 24, 25, which distribute the current from metal buses 26, 28 to the device fingers 6, 8, is chosen above the minimum allowable number of vias to avoid electromigration. This specific is given in terms of maximum current that can be sustained by each single contact and via (all contacts are supposed sustain the same current, and all vias are supposed sustain the same current) before experience electromigration issues. This value, given a material for contacts/vias and their dimensions, can be easily obtained through trials and errors, or get from the extensive literature in the field.

Figure 5:
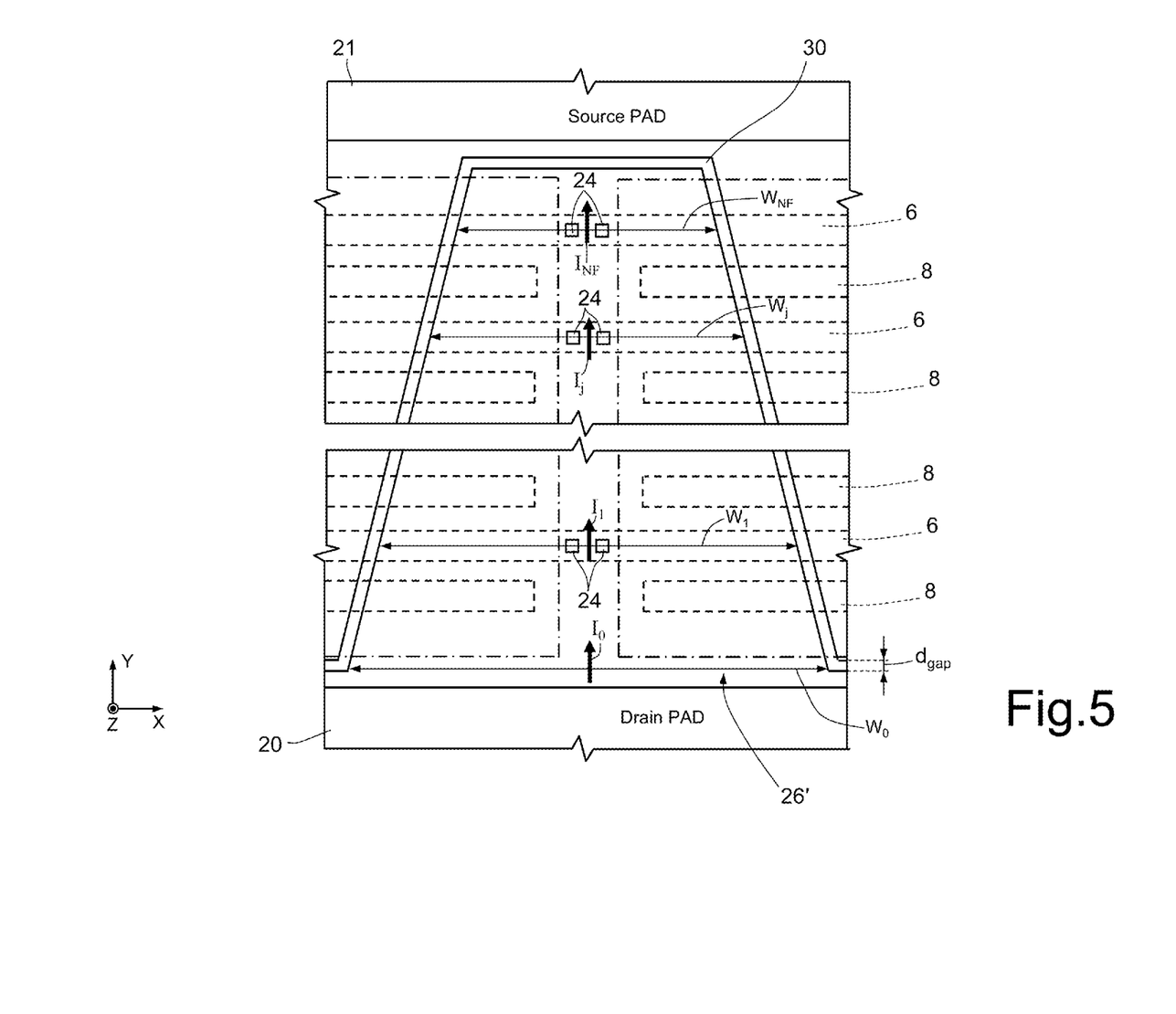
FIG. 5 shows a portion of the device of FIG. 1, on which design parameters are identified.

The geometry of the drain/source buses 26, 28 is described in greater detail referring to FIG. 5.

In FIG. 5, it is shown a generic metal bus subregion 26' coupled to the drain pad 20; however, the related description applies analogously to the metal bus subregion 28' coupled to the source pad 21.

The metal bus subregion 26' can be subdivided in a plurality $N_F$ of sections, each section being taken at a respective drain finger 6 (the j-th section of width Wj is taken at the j-th drain finger 6 starting the count from the drain pad 20 and moving away from it). The first section of width $W_0$ is taken at the main side a of the trapezoid defining the subregion 26' considered.

Here, the widths W0, . . . , Wj, $WN_F$ are taken parallel to the X axis and represent, at each section considered, the width, along X axis, of the subregion 26' (i.e., the distance along X axis between the oblique sides of the trapezoid that defines the subregion considered).

Due to the symmetry of the structure proposed according to the present disclosure, it is reasonable to consider an equal current sourced/sunk by each finger 6.

In a condition of even current density distribution, the current sourced/sunk by each finger 6, 8 is almost constant. This condition ensures an uniform biasing of the device 1. This assumption corresponds to a real situation for an adequate number $N_F$ of source and drain fingers 8, 6 for each device module 4 (e.g., $N_F$=10 or higher). The number $N_F$ of source and drain fingers 8, 6 is supposed to be the same; however, in general, the number of source and drain metal strips may differ from one another.

Figure 6:
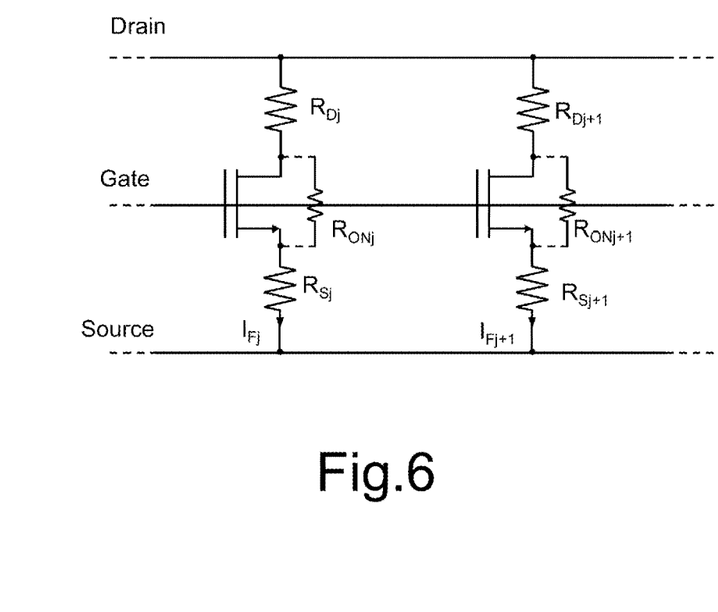
FIG. 6 is an equivalent circuit model of the portion of the device of FIG. 5.

The equivalent circuit model is represented in FIG. 6, according to a possible schematic representation. In FIG. 6, each module (referenced with numeral 4 in FIG. 1) of the GaN power device is split in a plurality $N_F$ of devices connected in parallel to one another; Ronj is the equivalent on-resistance of a generic j-th device (j=1, . . . , $N_F$). Therefore, for the j-th finger of the modules represented in FIG. 6, the parameters RDj, RSj and Ronj are the equivalent drain resistance, the equivalent source resistance and the equivalent on-resistance, respectively.

Still with reference to FIG. 6, the following equations describe the equivalent circuit model of device 1:

$$R_{Dj}+R_{ONj}+R_{Sj} \approx R_{Dj+1} R_{ONj+1}+R_{Sj+1}$$

$$I_{Fj} \approx I_{Fj+1}$$

for j=1, . . . , $N_F$.

Referring back to FIG. 5 and taking into account the previous considerations, to avoid electromigration and to guarantee the electrical isolation, the geometry of the subregions 26', 28' of the metal buses 26 and 28, in a top plan view, is chosen to satisfy the following constraints, at each j-th section taken along the first axis (X):

$$W_j \geq \frac{I_j}{J_{SPEC\_mtl}} \quad (1)$$

$$Ncont_j \geq \frac{I_{Source/Drain}}{I_{SPEC\_cont} N_{BUS} N_F} \quad (2)$$

$$Nvia_j \geq \frac{I_{Source/Drain}}{I_{SPEC\_via} N_{BUS} N_F} \quad (3)$$

$$d_{gap} > \frac{\Delta V}{E_{ds}} \quad (4)$$

For NF>>1, and j=1, . . . , $N_F$, the following relation is valid:

$$I_j \cong \frac{I_{Source/Drain}}{N_{BUS}}\left(1 - \frac{j-1}{N_F}\right) \quad (5)$$

It is noted that $W_0$ should satisfy constraint (1) for j=1, hence it can be chosen such that $W_0 \geq W_1$.

In the formulas (1)-(5) above:

$N_{BUS}$ is the number of subregions 26' or the number of subregions 28' (for the present disclosure, they are supposed to be equal in number);

$I_{source/drain}$ is the overall current provided by the drain pad 20 or source pad 21;

$I_j$ is the (theoretical) current at the j-th section of the subregion 26', 28' considered;

$N_{contj}$ is the number of contacts (referenced with numerals 16 and 18 in FIGS. 3 and 4) that connect the j-th drain/source finger to the j-th drain/source terminal (referenced with numerals 12 and 14 in FIGS. 3 and 4);

$N_{viaj}$ is the number of vias (referenced with numerals 24 and 25 in FIGS. 3 and 4) that connect the j-th drain/ source finger to the respective drain/source bus (referenced with numerals 26 and 28 in FIGS. 3 and 4);

$J_{SPEC\_mtl}$ is the maximum current density allowable to avoid electromigration effects in the considered metal bus electromigration (expressed as mA/μm);

$I_{SPEC\_cont}$ is the maximum current allowable to avoid electromigration in the considered contacts $I_{SPEC\_via}$ is the maximum current allowable to avoid electromigration in the considered vias;

$d_{gap}$ is the width of the insulating region 30;

ΔV is the maximum difference of potential between source and drain pads 20, 21;

$E_{ds}$ is the dielectric strength of the insulating layer 23 between metal layers MTL_1 and MTL_2 (expressed as V/m).

It is apparent that the previous formulas (1) and (5) define quantitatively the layout geometry of each subregion 26', 28' of the metal buses 26, 28.

The proposed geometries for power buses 26, 28, based on the trapezoidal-shaped, variable-width, metallizations, allow to carry high currents and in the meantime to respect the rules dictated by electromigration. Bus metallizations follows the gradient of the current distribution throughout the device. Therefore the on-chip area dedicated to the interconnections is minimized with respect to the active area, and the overall specific on-resistance ($R_{ON}$ multiplied by the die area) of the device is optimized.

Figure 7:
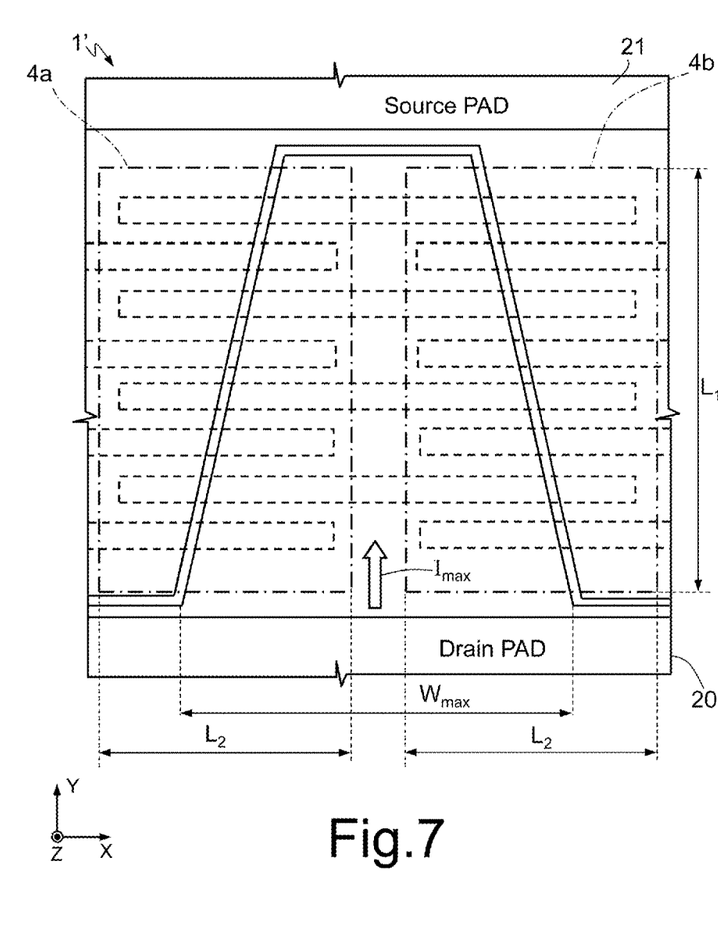
FIG. 7 shows a portion of the device of FIG. 1, on which further design parameters are identified.

The specific on-resistance optimization achieved by the proposed disclosure can be better understood with a numerical example and reference to FIG. 7.

Here, a power GaN device 1' is split in two modules 4a and 4b, both of them having, in top-plan view, rectangular shape with major side L1 and minor side L2; therefore the whole active area is 2·L1·L2.

Consider the following typical parameters for a power GaN device ($I_{max}$ being the maximum current at the drain pad 20):

$I_{max}$=10 A,
L2=700 μm,
$J_{spec}$=9 mA/μm (typical current density specification for a 4.5 μm-thick AlCu metallization), Then, a source/drain bus 26, 28 having maximum width $W_{max}=I_{bus}/J_{spec}$=1.2 mm-wide bus would avoid electromigration issues.

By applying the same math for each section Wj (also consider FIG. 5), electromigration constraints are respected along any bus section, maintaining an almost constant current density. In the example of FIG. 7, drain/source buses 26, 28 symmetrically overlap the active area without any "wasted area" (neglecting the minimum spacing between the two subsequent power modules 4a, 4b).

To provide a further numerical example, it will be reported the design of a power GaN device, based on the 0.5-μm channel length, 650 V TSMC GaN technology, which is desired to be compliant to the following specifications:

Vds=650 V
Ids (max)=30 A
On-resistance $R_{ON}$=30 mΩ

The technology specifies the following rules for electromigration:

$J_{SPEC\_mtl}$=9 mA/μm (thick metal)
$I_{SPEC\_cont}$=2.4 mA for each contact
$I_{SPEC\_via}$=4.3 mA for each via Moreover, a dielectric strength of $E_{ds}$=5 MV/cm can be considered for the dielectric layer.

To reach the target $R_{ON}$ of 30 mΩ, the GaN power device can be designed by including six modules (modules referenced as 4 in FIG. 1), 70-drain/source fingers per module, 140-gate fingers per module. The length (extension along the X axis) of each finger in each module 4 is $W_{finger}$=700 μm. Therefore, the overall perimeter of the power device is $W_g$=6 (number of modules) multiplied by 140 (number of gate fingers per module) multiplied by 700 μm (gate finger width) gives a result of 588 mm.

The geometry of the drain/source buses 26, 28 can be defined by using the previously indicated formulas (1)-(5) for Wj, $N_{cont\_j}$, Nviaj, $d_{gap}$ and Ij:

$N_{BUS}$=3
Isource/drain=30 A
ΔV=650V
W1>1100 μm (e.g., W1=1200 μm)
W70>16 μm (in this example, each module 4 houses seventy fingers of drain and source, so that $W_{NF}$=W70 is the width of the drain/source subregion bus 26'/28' measured at the 70-th finger—e.g., W70=500 μm)
$N_{cont\_j}$>59 (e.g., $N_{cont\_j}$=700)
Nvias_j>34 (e.g., $N_{via\_j}$>250)
$d_{gap}$>1.3 μm (e.g., $d_{gap}$=100 μm)

The expected specific on-resistance of the implemented device is $R_{ON}$×Area=6.68 mΩ/cm² (where "Area" is the total area of the chip, including pads and interconnections).

From what has been described and illustrated previously, the advantages of the present disclosure are evident.

In particular, high currents (e.g., >10 A) can be driven inside the integrated device by on-chip metals. The present disclosure enables low-cost and low-complexity post-processing steps (e.g., it does not require thick-Cu redistribution layers, RDL). The present disclosure does not require high-cost and high-complexity packaging. High currents can be safely carried without affecting the specific on-resistance of the device. A high FE-BE compatibility is obtainable.

Finally, it is clear that modifications and variations may be made to what has been described and illustrated herein, without thereby departing from the scope of the present disclosure.

In particular, the shape of the insulating region 30 can be varied with respect to the trapezoidal shape.

Figure 8A:
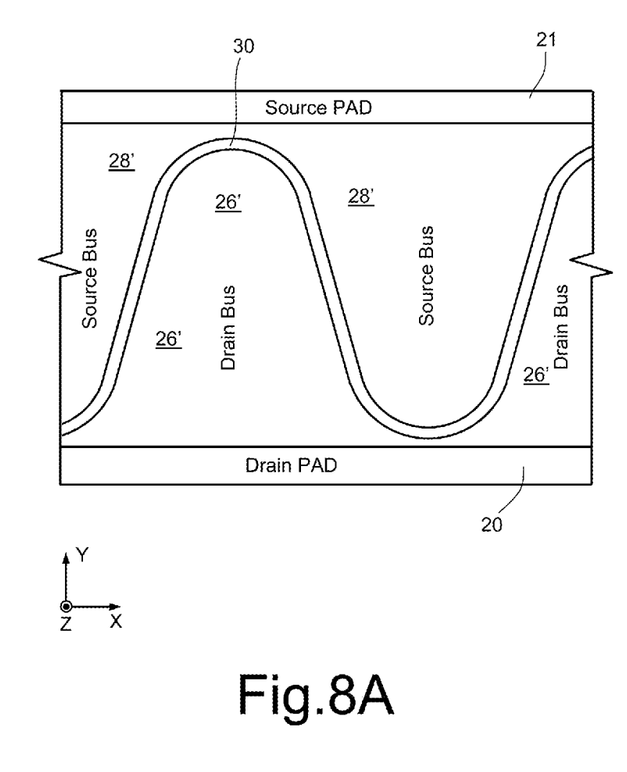
FIGS. 8A, 8B show using the same simplified view of FIG. 2, alternative embodiments according to respective aspects of the present invention.

FIG. 8A shows an insulating region 30 having a bell-curve shape (Gaussian shape) which approximates a trapezoidal shape.

Figure 8B:
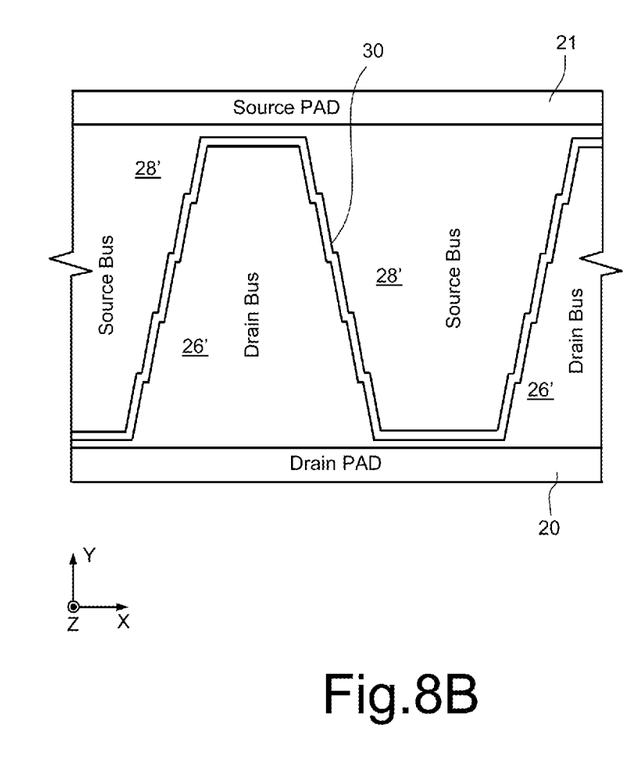

FIG. 8B shows an insulating region 30 having a "staircase" shape, which approximates a trapezoidal shape.

Moreover, also the drain pad 20 and the source pad 21 can be arranged in a different configuration that previously described.

FIG. 9A shows an embodiment including a plurality of pads 20', 21', each pad 20', 21' being formed within a respective subregion 26', 28', inside the active area.

FIG. 9B shows a further embodiment with "hourglass"-shaped drain buses, drain pads 20 arranged on opposite sides along Y axis, and source pads 21' inside the active area.

In general, irrespective of the embodiment chosen, the width (along X axis) of each drain/source metal bus is chosen to be higher close to the respective pad, and lower at the opposite side. In other words, the width (along X axis) of each drain/source metal bus decreases by moving away from the respective drain/source pad along the Y direction.

It is moreover noted that the previous description is based on a two metallization process; however, the previous disclosure can be easily generalized to any number of metals layers, and applied to shape metal buses belonging to more than one metal layer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a structural body including a substrate and a layer of gallium nitride on the substrate;
a source terminal, a drain terminal, and a gate terminal on top of and in contact with a top surface of the layer of gallium nitride;
a plurality of source metal strips coupled to the source terminal, the plurality of source metal strips including a first source metal strip and a second source metal strip;
a plurality of drain metal strips coupled to the drain terminal, the plurality of drain metal strips including a first drain metal strip and a second drain metal strip, the first drain metal strip being between the first and second source metal strips, the first drain metal strip having a first end spaced from a second end along a first direction, the first end of the first drain metal strip being aligned with a central region of the first source metal strip along a second direction that is transverse to the first direction;
a trapezoidal source metal bus on the plurality of source metal strips and on the plurality of drain metal strips; and
a trapezoidal drain metal bus spaced from the source metal bus, the drain metal bus being on the plurality of source metal strips and on the plurality of drain metal strips;
an insulating layer that separates the source metal bus from the drain metal bus:
a first conductive pad electrically coupled to the source metal bus; and
a second conductive pad electrically coupled to the drain metal bus.

2. The electronic device according to claim 1, wherein the insulating layer spaces the source metal bus from the adjacent drain metal bus by a distance which satisfies the following constraint:

$$d_{gap} > \Delta V / E_{ds}$$

wherein:
$\Delta V$ is a difference of potential between the first and second conductive pads; and
$E_{ds}$ is a dielectric strength of the insulating layer.

3. The electronic device according to claim 1, wherein the first end of the first drain metal strip is aligned with a central region of the second source metal strip along the second direction.

4. The electronic device according to claim 3, wherein the central region of the first and second source metal strips are aligned with the source metal bus along a third direction transverse to the second direction.

5. The electronic device according to claim 4, wherein each of the plurality of source metal strips having a first end spaced from a second end along the first direction, the first end and second end of each of the plurality of source metal strips are aligned with a central region of at least one drain metal strip of the plurality of the drain metal strips along the second direction.

6. The electronic device according to claim 1, wherein the first conductive pad and the second conductive pad are spaced from each other by the source metal bus and the drain metal bus.

7. The electronic device according to claim 1, wherein the first conductive pad includes a first pad that is positioned within the source metal bus.

8. The electronic device according to claim 7, wherein the second conductive pad includes a second pad that is positioned within the drain metal bus.

9. An electronic device, comprising:
a structural body including a semiconductor layer, the semiconductor layer including a first active region and a second active region;
a plurality of source metal strips in a first metal level, each source metal strip having a strip-like shape with a main direction of extension along a first axis, the plurality of source metal strips including:
a first source strip in the first active region;
a second source strip in the second active region, the second source strip being spaced from the first source strip along the first axis;
a plurality of drain metal strips in the first metal level, each drain metal strip having a strip-like shape with a main direction of extension along the first axis, the plurality of drain metal strips including:
a drain strip that extends from the first active region to the second active region, the drain strip being spaced from the first source strip and the second source strip along a second axis that is transverse to the first axis;
an insulating layer on the plurality of source metal strips and on the plurality of drain metal strips;
a source metal bus in a second metal level and electrically coupled to the first source strip and the second source strip, the source metal bus overlapping the first and second active regions;
a conductive source pad electrically coupled to the source metal bus;
a drain metal bus in the second metal level and electrically coupled to the drain strip, the insulating layer separating the drain metal bus from the source metal bus, the drain metal bus overlapping the second active region; and
a conductive drain pad electrically coupled to the drain metal bus, wherein:
the source metal bus has a first width, taken along the first axis, which decreases moving away from the conductive source pad along the second axis,
the drain metal bus has a second width, taken along the first axis, which decreases moving away from the conductive drain pad along the second axis.

10. The electronic device according to claim 9, wherein the insulating layer spaces the source metal bus from the adjacent drain metal bus by a distance which satisfies the following constraint:

$$d_{gap} > \Delta V / E_{ds}$$

wherein:
$\Delta V$ is a difference of potential between the conductive drain and source pads; and
$E_{ds}$ is a dielectric strength of the insulating layer.

11. The electronic device according to claim 9, wherein each source and drain metal bus has a trapezoidal shape.

12. The electronic device according to claim 9, wherein the second source strip being spaced from the first source strip along the first axis with a first distance, the first distance is aligned with a central region of the drain strip along the second axis.

13. The electronic device according to claim 9, wherein the conductive drain pad is spaced from the conductive source pad by the source metal bus.

14. The electronic device according to claim 9, wherein the conductive source pad includes a source pad element that is positioned within the source metal bus.

15. The electronic device according to claim 14, wherein the conductive drain pad includes a drain pad element that is positioned within the drain metal bus.

16. The electronic device according to claim 9, wherein the semiconductor layer including a third active region, the drain metal bus overlapping the third active region.

17. The electronic device according to claim 9, wherein the drain metal bus has an hourglass shape.

18. An electronic device, comprising:
- a structural body including a semiconductor layer;
- a plurality of source metal strips in a first metal level on the semiconductor layer;
- a plurality of drain metal strips in the first metal level on the semiconductor layer;
- a first drain pad spaced from a second drain pad along a first direction;
- a source pad positioned between the first and second drain pads along a second direction transverse to the first direction;
- a source metal bus in a second metal level, the source pad coupled to a central region of the source metal bus;
- a drain metal bus in the second metal level and extending between the first and second drain pads; and
- an insulating layer that separates the source metal bus from the drain metal bus, the insulating layer completely surrounding the source metal bus, the insulating layer extending from the first drain pad to the second drain pad.

19. The electronic device according to claim 18, wherein the source metal bus has is one from among: trapezoidal shape, bell shape, and staircase shape.

20. The electronic device according to claim 18, wherein each of the plurality of source metal strips being spaced from one another along the first direction with a plurality of gaps, each of the plurality of gaps is aligned with a central region of one of the plurality of drain metal strips along the second direction.

* * * * *